United States Patent
Sakai et al.

(10) Patent No.: US 7,632,710 B2
(45) Date of Patent: Dec. 15, 2009

(54) METHOD FOR SOLDERING ELECTRONIC COMPONENT AND SOLDERING STRUCTURE OF ELECTRONIC COMPONENT

(75) Inventors: Tadahiko Sakai, Fukuoka (JP); Tadashi Maeda, Fukuoka (JP); Mitsuru Ozono, Fukuoka (JP)

(73) Assignee: Panasonic Corporation, Osaka (JP)

( * ) Notice: Subject to any disclaimer, the term of this patent is extended or adjusted under 35 U.S.C. 154(b) by 32 days.

(21) Appl. No.: 11/817,522

(22) PCT Filed: Nov. 10, 2006

(86) PCT No.: PCT/JP2006/322902

§ 371 (c)(1),
(2), (4) Date: Aug. 31, 2007

(87) PCT Pub. No.: WO2007/055410

PCT Pub. Date: May 18, 2007

(65) Prior Publication Data

US 2009/0233117 A1    Sep. 17, 2009

(30) Foreign Application Priority Data

Nov. 10, 2005 (JP) ............................. 2005-325707

(51) Int. Cl.
| H01L 21/50 | (2006.01) |
| H01L 21/48 | (2006.01) |
| H01L 21/44 | (2006.01) |
| H01L 23/52 | (2006.01) |
| H01L 23/48 | (2006.01) |
| H01L 23/40 | (2006.01) |
| H01L 23/485 | (2006.01) |
| H01L 23/488 | (2006.01) |

(52) U.S. Cl. .................. 438/108; 438/613; 438/612; 257/780; 257/778; 257/779; 257/738; 257/E23.021; 257/E23.023

(58) Field of Classification Search ................. 438/108, 438/613, 612; 257/778–780, 738, E23.021, 257/E23.023
See application file for complete search history.

(56) References Cited

U.S. PATENT DOCUMENTS 5,234,149 A * 8/1993 Katz et al. ............... 228/123.1

(Continued)

FOREIGN PATENT DOCUMENTS

| EP | 1736273 | 12/2006 |
| JP | 2000-031210 | 1/2000 |
| WO | 2005-072906 | 8/2005 |

OTHER PUBLICATIONS

International Search Report Dated Mar. 21, 2007.

*Primary Examiner*—Luan C Thai
(74) *Attorney, Agent, or Firm*—Pearne & Gordon LLP

(57) ABSTRACT

In soldering an electronic component, for the purpose of leading molten solder during re-flow, metallic powder 8 is mixed into flux employed so as to intervene between a bump and an electrode. The metallic powder 8 has a flake or dendrite shape including a core segment 8a of the metal molten at a higher temperature than the liquid phase temperature of solder constituting a solder bump and a surface segment 8b of the metal with good-wettability for the molten solder and to be solid-solved in the core segment 8a molten. In the heating by the re-flow, the metallic powder remaining in the flux without being taken in a solder portion is molten and solidified to become substantially spherical metallic particles 18. Thus, after the re-flow, the metallic powder does not remain in a flux residue in a state where migration is likely to occur, thereby combining both solder connectivity and insurance of insulation.

9 Claims, 8 Drawing Sheets

U.S. PATENT DOCUMENTS

| | | |
|---|---|---|
| 5,672,542 A | 9/1997 | Schwiebert et al. |
| 6,121,062 A * | 9/2000 | Karasawa et al. ............ 438/15 |
| 6,189,771 B1 * | 2/2001 | Maeda et al. ............ 228/248.1 |
| 6,297,560 B1 * | 10/2001 | Capote et al. ............... 257/778 |
| 6,495,397 B2 * | 12/2002 | Kubota et al. ................ 438/108 |
| 6,566,234 B1 * | 5/2003 | Capote et al. ............... 438/458 |
| 7,244,634 B2 * | 7/2007 | Suh et al. .................... 438/108 |
| 2004/0177997 A1 | 9/2004 | Hata et al. |

* cited by examiner

METHOD FOR SOLDERING ELECTRONIC COMPONENT AND SOLDERING STRUCTURE OF ELECTRONIC COMPONENT

BACKGROUND OF THE INVENTION

1. Field of the Invention

This invention relates to a method for soldering an electronic component on a substrate and a soldering structure of the electronic component.

2. Related Art

As a method for mounting an electronic component on a substrate, traditionally, soldering has been widely employed. The manner of soldering includes various techniques such as a method of forming a metallic bump serving as a connecting electrode formed on the electronic component by soldering and a method of "solder-precoating" of forming a solder layer on the electrode surface of the substrate. In recent years, from the point of view of environmental protection, in the above soldering, "lead-free solder" containing a least quantity of harmful lead has been adopted.

The lead-free solder is greatly different from the lead-series solder conventionally employed in their composition. Therefore, as regards the flux employed in a soldering process, the flux conventionally generally employed cannot be adopted as it is. Specifically, the conventional flux has an insufficient activating operation so that removal of an oxidation film on a solder surface is insufficient. Thus, it is difficult to assure good solder-wettability. For such solder having inferior solder-wettability, the flux having the composition in which metallic power of the metal with excellent solder-wettability such as silver is mixed has been proposed (for example, see JP-A-2000-31210). By using such flux, the solder molten in a re-flow process can be wet-spread along the surface of the metallic powder in the flux so that the solder molten can be led to an electrode which is a connecting target.

However, in the flux disclosed in the above Patent Reference, as the case may be, the following inconvenience has occurred according to the contents of the metallic powder. The mainstream in recent years is a non-cleaning technique in which cleaning for eliminating the flux component is not carried out after the soldering. Therefore, after the re-flow, the flux component remains as a residue deposited around a soldered portion. So the metallic powder contained in the flux also remains around the soldered portion.

At this time, if a large quantity of metallic powder remains, poor insulation due to migration may occur. In this case, if the contents of the metallic powder are reduced in order to prevent the poor insulation, the effect of leading the molten solder by the metallic powder in the re-flow process is lowered. As a result, the solder-connectivity was deteriorated. Particularly, in the soldering for manufacturing a semiconductor device by stacking a package component with semiconductor elements packaged in a resin substrate, a gap is likely to occur between the bump to be soldered and an electrode owing to warping of the resin substrate. As a result, poor connection due to solder-wettability occurred with high frequency. As described above, the conventional soldering method using the flux containing the metallic powder has a problem that it is difficult to combine the maintenance of solder-connectivity and assurance of insulation.

SUMMARY OF THE INVENTION

In view of the above circumstances, an object of this invention is to provide a method of soldering an electronic component, capable of combining solder-connectivity and assurance of insulation and a soldering structure of the electronic component.

One aspect of the invention provides a method for soldering an electronic component on a substrate such that a solder bump formed on the electronic component aligned with an electrode of the substrate is heated and the solder bump thus molten is soldered on the electrode, comprising the steps of: aligning the solder bump of the electronic component with the electrode of the substrate with flux intervening between the solder bump and the electrode, the flux containing metallic powder having a flake or dendrite shape including a core segment of the metal molten at a higher temperature than the liquid phase temperature of solder constituting the solder bump and a surface segment of the metal with good-wettability for the solder molten and to be solid-solved in the core segment molten; heating the electronic component and the substrate to melt the solder bump so that the molten solder is wet and spread along the surface of the metallic powder to reach the electrode; further continuing heating so that the metallic powder remaining without being in contact with the molten solder is molten into substantially spherical shape; and thereafter cooling the substrate and the electronic component so that the molten metallic powder and the solder are solidified.

Another aspect of the invention provides a method for soldering an electronic component on a substrate such that a solder bump formed on the electronic component aligned with an electrode of the substrate is heated and the solder bump thus molten is soldered on the electrode, comprising the steps of: aligning the solder bump of the electronic component with the electrode of the substrate with thermosetting resin intervening between the solder bump and the electrode, the thermosetting resin containing metallic powder having a flake or dendrite shape including a core segment of the metal molten at a higher temperature than the liquid phase temperature of solder constituting the solder bump and a surface segment of the metal with good-wettability for the solder molten and to be solid-solved in the core segment molten; heating the electronic component and the substrate to melt the solder bump so that the molten solder is wet and spread along the surface of the metallic powder to reach the electrode; further continuing the heating so that the metallic powder remaining without being in contact with the molten solder is molten into substantially spherical shape; promoting a hardening reaction of the thermosetting resin by the heating; and thereafter cooling the substrate and the electronic component so that the molten metallic powder and the solder are solidified.

Another aspect of the invention provides a soldering structure of an electronic component soldered on a substrate by the soldering method, comprising having a solder portion for connecting the electronic component and the electrode and a flux residue remaining on the surfaces of the solder portion and of the substrate, wherein metallic particles created as a result that the metallic powder not brought into contact with the molten solder is molten to become spherical are contained in the flux residue.

Another aspect of the invention provides a soldering structure of an electronic component soldered on a substrate by the soldering method, comprising having a solder portion for connecting the bump and the electrode of the substrate and a resin portion for reinforcing a connecting portion between the solder portion and the electrode, wherein metallic powder created as a result that the metallic powder not brought into contact with the molten solder are molten to become substantially spherical are contained in the resin portion.

According to the invention, the metallic powder mixed for the purpose of leading molten solder during re-flow has a flake or dendrite shape including a core segment of the metal molten at a higher temperature than the liquid phase temperature of solder constituting a solder bump and a surface segment of the metal with good-wettability for the molten solder and to be solid-solved in the core segment molten. Therefore, the remaining metallic powder is molten during the re-flow to fall in their substantially spherical state which is difficult to generate migration. Thus, both solder connectivity and insurance of insulation can be combined.

DETAILED DESCRIPTION OF THE PREFERRED EMBODIMENTS

Embodiment 1

Figure 1A:
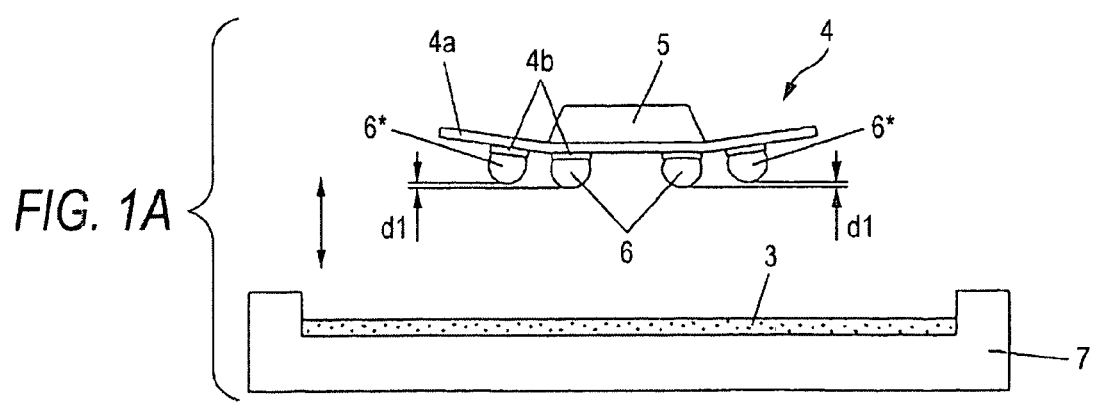
FIGS. 1A to 1C are views for explaining the process of mounting an electronic component according to the first embodiment of this invention.
Figure 1B:
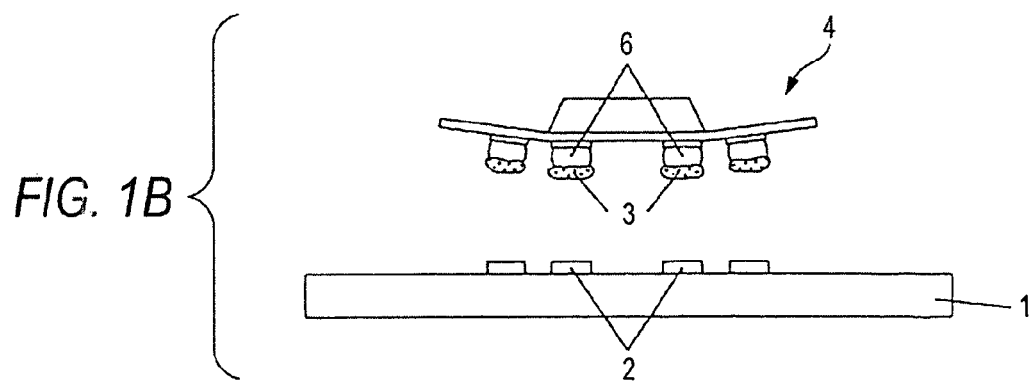
Figure 1C:
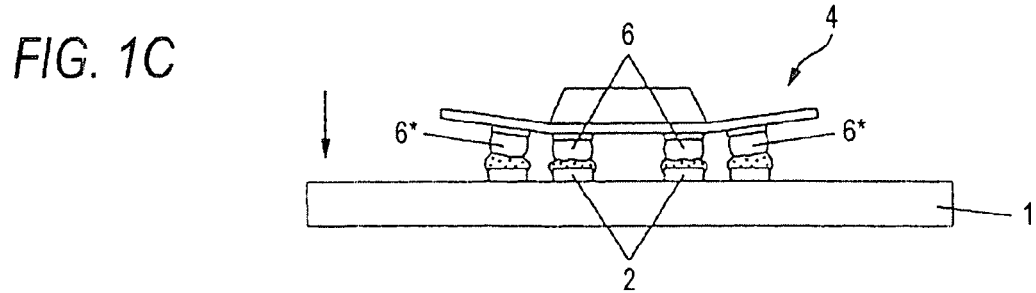
Figure 2A:
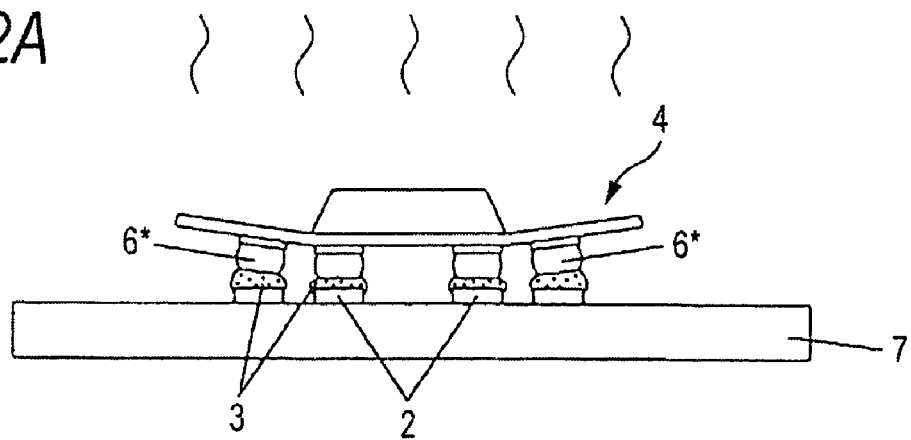
FIGS. 2A to 2C are views for explaining the process of mounting an electronic component according to the first embodiment of this invention.
Figure 2B:
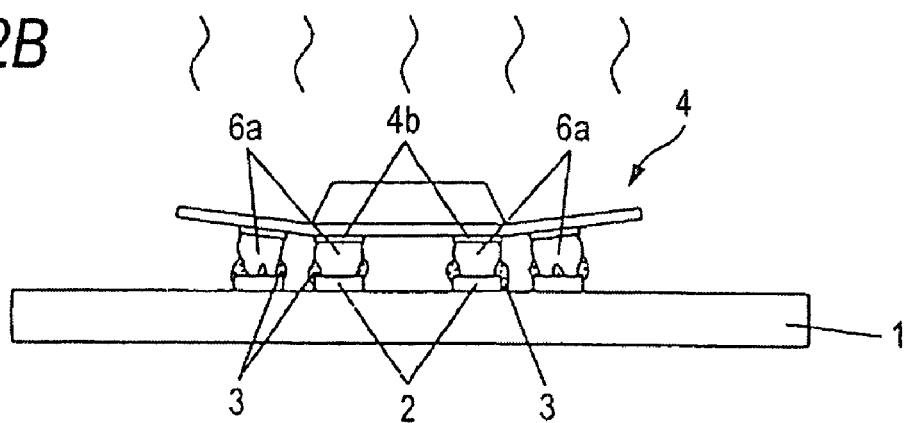
Figure 3A:
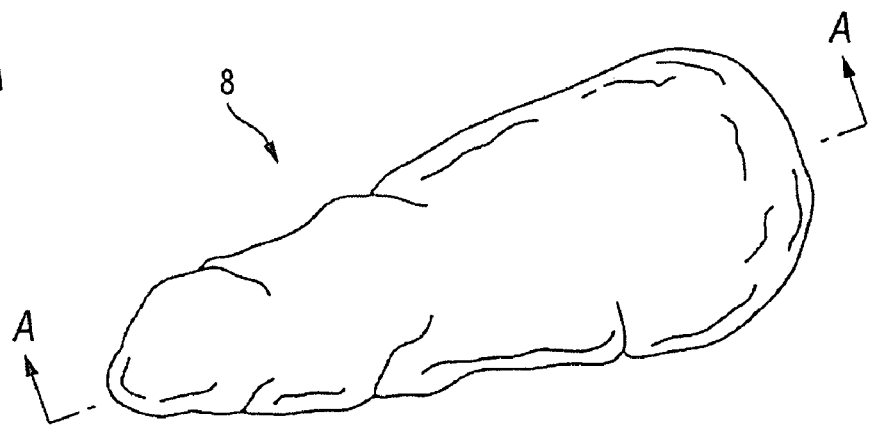
FIGS. 3A and 3B are views for explaining the shape and composition of the flux employed in the method for soldering an electronic component according to the first embodiment of this invention.
Figure 3B:
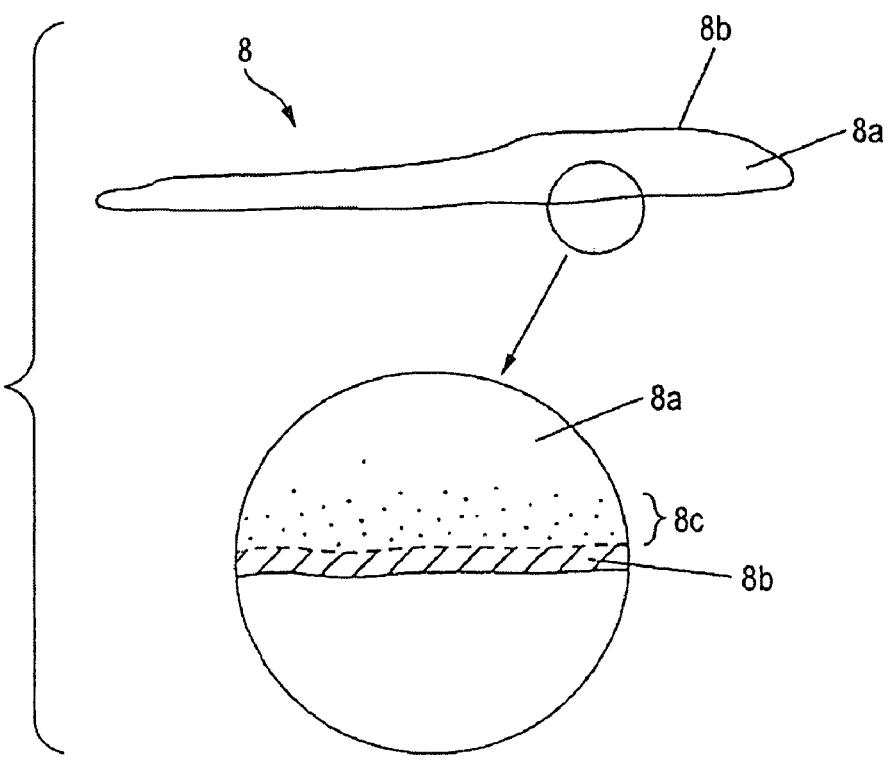
Figure 4A:
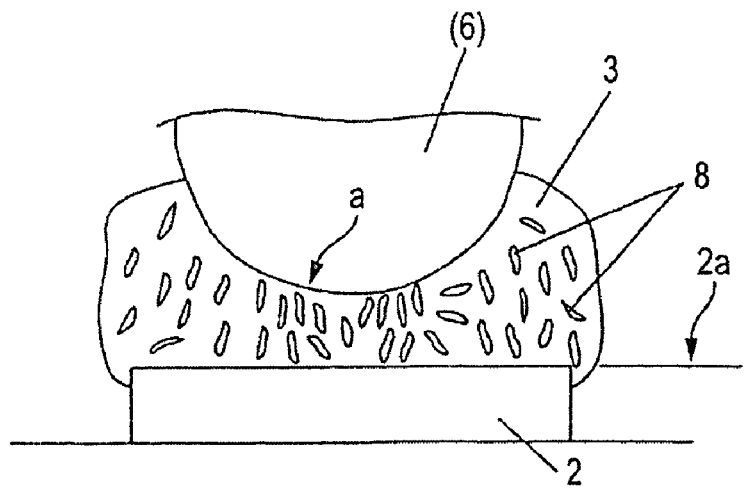
FIGS. 4A to 4C are views for explaining the process of solder-connection in the method for soldering an electronic component according to the first embodiment.
Figure 4B:
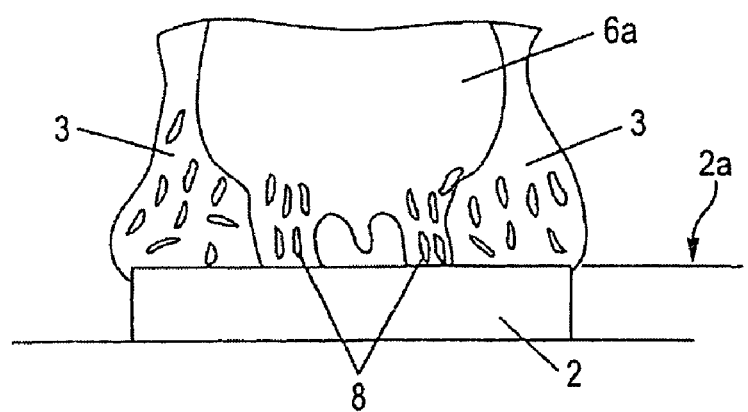
Figure 4C:
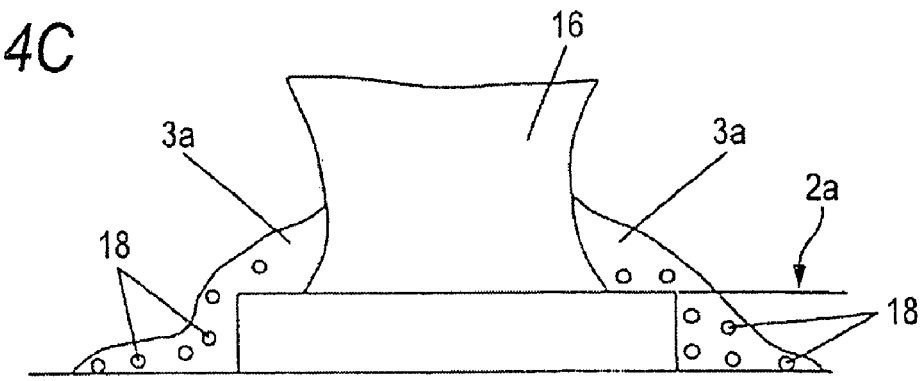
Figure 5A:
FIGS. 5A to 5C are sectional views of a metallic powder contained in the flux employed in the method for soldering an electronic component according to the first embodiment of this invention.
Figure 5B:
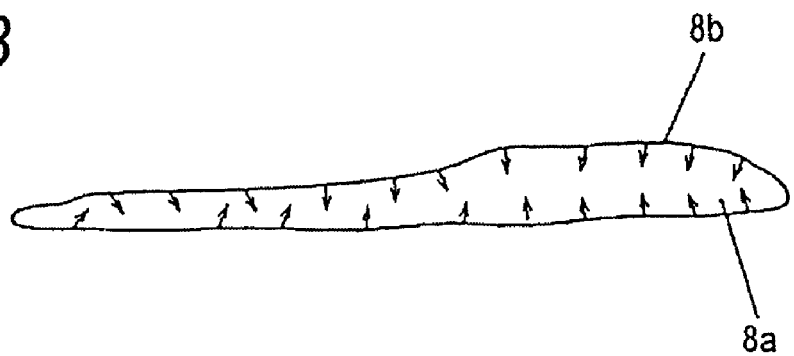
Figure 5C:
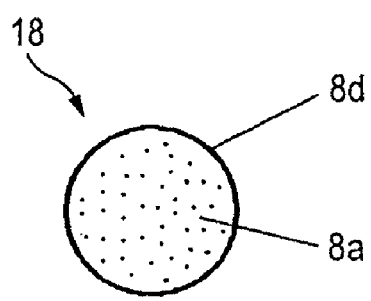
Figure 6:
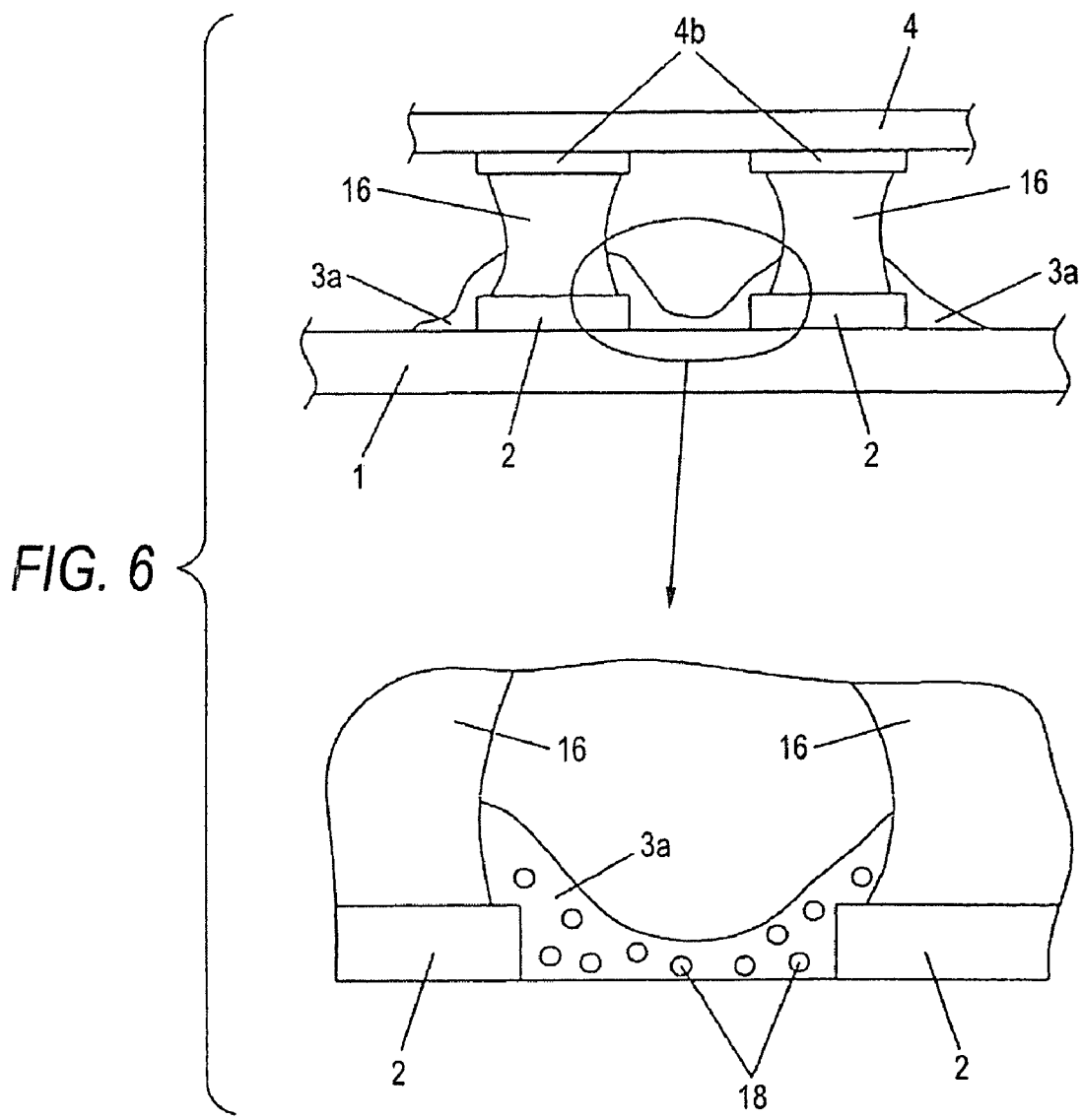
FIG. 6 is a sectional view of the soldering structure of an electronic component according to the first embodiment.
Figure 7A:
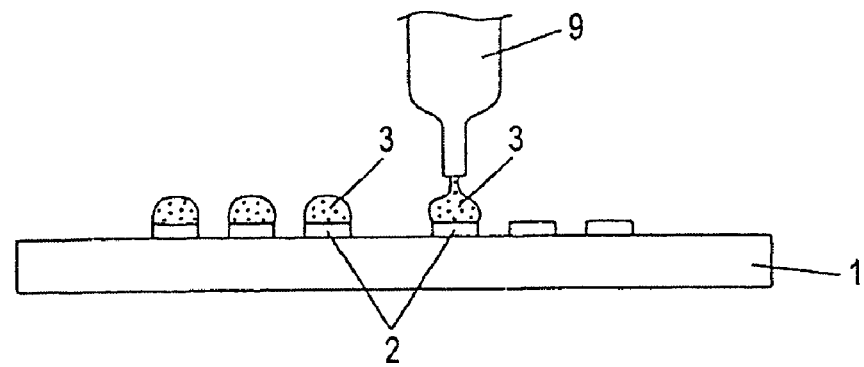
FIGS. 7A to 7C are views for explaining the method for supplying paste for solder-connection in the mounting of an electronic component according to the first embodiment of this invention.
Figure 7B:
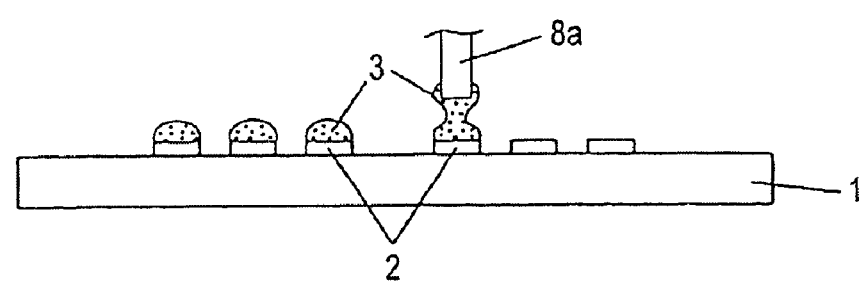
Figure 7C:
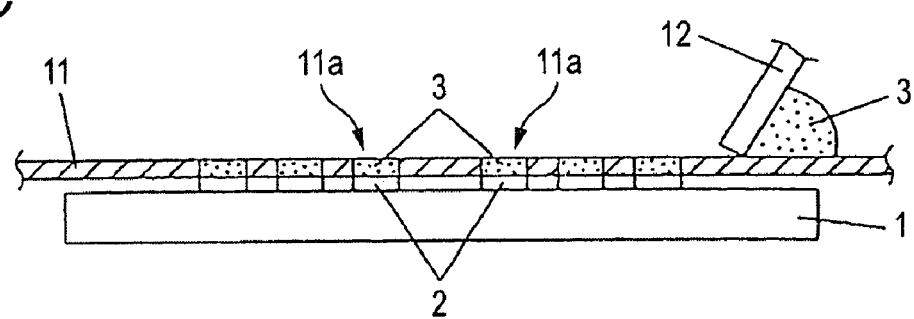

FIGS. 1A to 1C and 2A to 2C are views for explaining the process of a method for soldering an electronic component according to the first embodiment of this invention. FIGS. 3A and 3B are views for explaining the shape and composition of metallic powder contained in the flux employed in the method for soldering an electronic component according to the first embodiment of this invention. FIGS. 4A to 4C are views for explaining the process of solder-connection in the method for soldering an electronic component according to the first embodiment of this invention. FIGS. 5A to 5C are sectional views of the metallic powder contained in the flux employed in the method for soldering an electronic component according to the first embodiment of this invention. FIG. 6 is a sectional view of a soldering structure of the electronic component in the first embodiment of this invention. FIGS. 7A to 7C are views for explaining the method for supplying paste for solder-connection in mounting an electronic component according to the first embodiment of this invention.

First, referring to FIGS. 1A to 1C and 2A to 2C, an explanation will be given of a method for soldering an electronic component. In this method for soldering an electronic component, a solder bump formed on the electronic component aligned with an electrode of a substrate is heated and the solder bump thus molten is solder-connected to the electrode. By such a soldering method, the electronic component is mounted on the substrate.

In FIG. 1A, electrodes 2 are formed on the upper surface of a substrate 1. An electronic component 4 has a structure in which component electrodes 4b are formed on the lower surface of a resin substrate 4a with a component mounting portion 5 formed on the upper surface, and solder bumps 6 (hereinafter simply referred to as bumps 6) are formed on the component electrodes 4b. The bumps 6 are formed by solder-connecting a fine-granular solder ball to the component electrodes 4b. Incidentally, the "solder" refers to a metal having a low melting point (e.g. tin) or alloy composed of plural kinds of metals (e.g. silver-tin alloy). Now, the lead-free solder containing a least quantity of lead in these metal and alloy is employed as a solder material.

The component mounting portion 5 is formed by resin-sealing a semiconductor element (not shown) mounted on the upper surface of the resin substrate 4a. In this resin-sealing step, the resin at a high temperature in a molten state is injected into a mold cavity and thermally hardened to form a resin mold. The resin mold thus formed is removed from the mold cavity and cooled in the air. In this cooling step, owing to a difference in a thermal expansion coefficient between the resin substrate 4a and the resin mold, the component mounting portion 5 on the upper side of the resin substrate 4a contracts more greatly than the resin substrate 4a. Thus, the entire electronic component 4 is deformed in such a fashion that the end of the resin substrate 4a is warped toward the component mounting portion 5.

Thus, among the plurality of bumps 6 formed on the lower side of the electronic component 4, the lower end of each of the bumps 6* located at the outer edges is located at a higher position by a displacement d1 due to warping deformation than that of each of the bumps located inside. Therefore, the heights of the lower ends of the bumps 6 are not in flush with one another so that in a status where the electronic component 4 is loaded on the substrate 1, a gap is likely to occur between the bumps 6* and the corresponding electrodes 2.

Flux 3 as described below is applied on each of the bumps 6 by duplication. Specifically, by moving up and down the electronic component 4 for a duplicating table 7 with a deposited film of the flux 3, as seen from FIG. 1B, the flux 3 is duplicated/applied on the lower end of each of the bumps 6. The flux 3, in the solder-connection for soldering the electronic component 4 on the substrate 1 described below, is employed to intervene between bumps 6 and electrodes 2 in order to improve the solder-connectivity.

Now, the composition of the flux 3 will be explained. The flux 3 is obtained by mixing an activator and metallic powder 8 as additives into a liquid base agent with high viscosity in which a resin component such as rosin is solid-solved in a solvent. The activator is added for the purpose or removing an oxidation film of the solder created on the surface of each the bumps 6. To this end, an organic acid having a capability of removing the oxidation film is employed. Incidentally, now, as the activator, the activator having low activity which is not required to be cleaned after the solder connection is adopted.

As the metallic powder 8, as seen from FIG. 3A, a flake powder formed by crushing a fine-granular metal is employed. FIG. 3B shows a section taken along line A-A of the metallic powder 8 in FIG. 3A. As seen from FIG. 3B, the metallic powder 8 is composed of a core segment 8a and a surface segment 8b covering the surface of the core segment 8a. At the boundary between the surface segment 8b and the core segment 8a, a diffused layer 8c in which the metal constituting the surface segment 8b is diffused in the core segment 8a is formed. In such a configuration, the species of metal used in the core segment 8a is selected from the group consisting of tin (Sn) and tin-series alloy. The surface segment 8b is formed by covering the surface of the core segment 8a by the technique such as electroplating.

The tin series alloy may be a tin-silver (Sn—Ag) series, tin-silver-copper (Sn—Ag—Cu) series, tin-lead (Sn—Pb) series, tin-lead-silver (Sn—Pb—Ag) series, tin-copper (Sn—Cu) series, tin-bismuth (Sn—Bi) series, tin-silver-bismuth (Sn—Ag—Bi) series, tin-silver-bismuth-indium (Sn—Ag—Bi—In) series, tin-antimony (Sn—Sb) series, tin-indium (Sn—In) series, tin-zinc (Sn—Zn) series, tin-zinc-bismuth (Sn—Zn—Bi) series, or tin-zinc-aluminum (Sn—Zn—Al) series.

As a metallic species of the surface segment 8b, selected is the material which will be molten at a higher temperature than the liquid phase temperature of the solder employed for the bump 6 and does not create the oxidation film on the surface of the metallic powder 8 in the air and further gives good wettability for the solder constituting the bump 6 so that the solder in the flowing state of the molten bump 6 is likely to be wet and spread along the surface (e.g. noble metal such as gold (Au), silver (Ag) or platinum (Pt) having purity of 90% or more). Its addition to the flux 3 is executed by mixing such metallic powder 8 into the basic agent with a percent within a range of 1 to 20 vol %.

Now, as the combination of the metal species employed in the core segment 8a and the surface segment 8b, selected is a combination capable of realizing a diffusion characteristic that the diffusion from the surface segment 8b to the internal core segment 8a (see FIG. 5B is likely to occur by heating in a re-flow process and when the re-flow is completed, the diffusion from the surface segment 8b to the core segment 8a is completed so that the greater part of metal in the surface segment 8b is taken into the core segment 8a. In such a composition, the surface segment 8b is made of the metal with excellent wettability or the solder, and the core segment 8a is made of the metal permitting the surface segment 8b to be molten by heating due to re-flow and internally taken. By adopting such a composition for the metallic powder to be mixed into the flux 3, the excellent effect described later can be obtained in the solder-connection by the non-cleaning system.

In the above embodiment, the metallic powder 8 is flake so that the surface area per unit weight is as possible as large. However, the metallic powder 8 may be dendrite so that fine bar-like metal is branched three-dimensionally. Such branched metallic powder can also increase the surface area per unit weight to the utmost.

If the flake metallic powder and dendrite powder are mixed with each other, the surface are per unit weight can be increased. In addition, the structural features of both types of powders are combined in a status where the metallic powder is mixed into the flux 3 so that the metallic powder by a small weight % can be distributed uniformly and with high density to the utmost in the flux 3.

Namely, the flux 3 adopted in the soldering method according to this embodiment contains the flake or dendrite metallic powder 8 composed of the core segment 8a of the metal which is molten at a higher temperature than the liquid-phase of the solder constituting the solder bump 6 and the surface segment 8b of the metal which has good wettability for the molten solder and is solid-solved into the molten core segment 8a.

Next, as seen from FIG. 1C, the electronic component 4 after the flux has been duplicated/applied is mounted on the substrate 1. The mounting of the electronic component 4 on the substrate 1 is carried out by melting the bumps 6 by heating so that the molten bumps 6 are continuously solder-connected to the upper surface of the electrodes. Thus, the respective component electrodes 4b are electrically connected to the corresponding electrodes 2 and the electronic component 4 is fixed to the substrate 1 through the solder portions which have been formed by solidification of the molten solder.

In this mounting process, with the bumps 6 being aligned with the electrodes 2, the electronic component 4 located above the substrate 1 is lowered toward the substrate 1. The bumps 6 with the flux 3 applied are landed on the electrodes 2 and pressed by a predetermined pressing load. Thus, of the plurality of bumps 6, even if the bumps 6 with the lower end located at an average height have slight changes in their height, their lower ends are brought into contact with the upper surface of the electrodes 2 because the higher bumps 6 are slightly crushed by the pressing force in the height direction. On the other hand, even when the other bumps 6 are slightly crushed so that the entire electronic component 4 is lowered correspondingly, their lower ends of the bumps 6* located at the outer edges are not brought into contact with the surface of the electrodes 2. Thus, the bumps 6* are in a state where there is a gap between the lower surface of the bumps and the electrodes 2.

Next, an explanation will be given of the step of melting the bumps 6 so as to be solder-connected to the electrodes 2. The substrate 1 with the electronic component loaded as shown in FIG. 1C is forwarded to a re-flow furnace and heated. At this time as shown in FIG. 2A, heating is carried out in a status where in the bumps 6 in the vicinity of the center whose lower ends are located at the average height, their lower ends are kept in contact with the electrodes 2 and in the bumps 6* located at the outer edges, the flux 3 intervene between their lower ends and the electrodes 2.

By this heating, both bumps 6, 6* are solder-connected to the electrodes 2. The behavior of the solder at this time differs according to whether or not the bump lower end is in contact with the electrode 2. Specifically, as seen from FIG. 2B, in the bump 6 with the lower end being in contact with the electrode 2, when it is molten by heating, the solder 6a in the molten state immediately spreads favorably along the surface of the electrode 2 of the material with good solder-wettability so that the component electrode 4b is coupled through the electrode 2 and the solder 6a. At this time, the oxidation film on a surface of the bump 6 is removed by the activator contained in the flux 3.

On the other hand, in the bump 6* with the flux 3 residing in the gap between itself and the electrode 2, the component electrode 4b and the electrode 2 are coupled with each other by the solder 6a via the process shown in FIGS. 4A to 4C. FIG. 4A shows the state when heating is started in the re-flow process.

Now, the metallic powder 8 in the flux 3 intervening the lower end of the bump 6* and the surface 2a of the electrode 2 remains mixed in the flux 3, i.e. reside in a state the flake core segment 8a is covered with the surface segment 8b as shown in FIG. 5A. Since a lot of the metallic powder 8 resides in a random posture within the flux 3, bridges of the metallic powder 8 coupling the lower end of the bump 6* and the surface 2a of the electrode 2 are formed with a high probability (see portion indicated by arrow a in FIG. 4A).

Now, the "bridge" refers to the state where the metallic powder 8 resides as a continuous series in a state adjacent to each other. The "adjacent state" refers to the state where a plurality of metallic powders 8 reside at intervals such that when the solder in a flowing state wet-covering the surface of a certain metallic powder 8 creates a certain thickness by its surface tension, the surface of the solder thickness is brought into contact with the contiguous other metallic powder 8.

Specifically, since the large amount of metallic powder 8 resides continuously in such a contiguous state, the solder in contact with the metallic powder 8 on the one side of the series of the metallic powder is wet and spreads so as to wrap the surface of the metallic powder 8 containing the metal with good solder-wettability and so it is successively brought into contact with the adjacent metallic powders 8. The flow of the solder through this propagation is continuously created to the other side of the series of the metallic powder. Thus, the series of the metallic powder 8, as seen from FIG. 4B, serve as a bridge which couples the lower end of the bump 6* with the surface 2*a* of the electrode 2 so that the solder flows.

In this case, since the surface segment 8*b* constituting the metallic powder 8 is made of the noble metal such as gold or silver having a higher melting point than the liquid phase temperature of the solder generally employed, even if it is heated to the higher temperature than the liquid phase temperature of the solder, the surface segment 8*b* surely resides in a solid state. Specifically, in the solder-connecting method using creamy solder containing solder particles in the flux 3, the solder particles in the creamy solder are simultaneously molten due to heating in the re-flow so that the function of bridging the molten solder within the gap cannot be obtained. On the other hand, in the flux 3 according to this embodiment, the metallic powder can surely carry out the above bridging function.

The metallic power 8 employed in the flux 3 uses expensive noble metal such as gold or silver as the surface segment 8*b* covering the surface of the inexpensive core segment 8*a*. For this reason, as compared with the method of using the expensive noble metal, as it is, as powder body in the conventional metallic-powder containing flux, great cost reduction can be realized. Incidentally, although the solder made of the alloy (e.g. Sn—Ag series solder) composed of the metal species selectable as the core segment 8*a* and silver has already been proposed, such solder should be definitely distinguished from the metallic powder 8 according to this embodiment from the point of view of the operational advantage obtained by the metallic powder 8.

Now, by using the flake shape of the metallic powder 8 obtained by processing the above metal, the bridges can be easily formed by the metallic powder 8 residing with the posture with its longitudinal direction oriented in the gap bridging direction. Thus, the bridges can be formed effectively with the low percentage of contents. Once the solder 6*a* reaches the electrode surface 2*a* via such a bridge, the solder 6*a* in the flowing state wet-expands along the electrode surface 2*a* with good solder-wettability. Owing to the wet-expansion of the solder 6*a*, the flux 3 in the vicinity of the electrode surface 2*a* is pushed aside so that in also the bump 6* having initially giver the gap between itself and the electrode 2, the component electrode 4*b* is completely coupled with the electrode 2 by the solder 6*a*.

In this case also, the connectivity is improved by the activator contained in the flux 3. However, owing to the above bridge forming effect, even where the oxidation film on the bump surface is only partially removed, the activator contained in the flux 3 is not required to have a strong activating action. In other words, addition of the metallic powder 8 permits the low-activity flux with weak activating action to be employed. Thus, even where the flux 3 remains after solder-connection, the degree of corrosion of the electrode 2 by the active component is low. Accordingly, in cooperation with the effect of improving the insulation due to the characteristic of the metallic powder 8 described later, also in the non-cleaning technique in which cleaning for removing the flux is not carried out after the solder-connection, sufficient reliability can be assured.

In the above re-flow process, in the metallic powder 8 of a piece as shown in FIG. 5A, by continuing the heating, as shown in FIG. 5B, the surface segment 8*b* is gradually taken into the core segment 8*a* by diffusion. According to the metal specie of the core segment 8*a* and the heating temperature, there are two cases where the surface segment 8*b* is diffused into the core segment 8*a* in a liquid phase and where the surface segment 8*b* is diffused into the core segment 8*a* in a solid phase. In both cases, the surface segment 8*b* is gradually taken in the core segment 8*a*.

Since the metallic powder 8 is heated to the temperature higher than the melting point of the metal constituting the core segment 8*a*, the core segment 8*a* with the surface segment 8*b* taken in by solid-solution is molten and the core segment 8*a* thus molten is condensed by surface tension. The core segment 8*a* is subsequently cooled and solidified, which results in a metallic particle 18 having a substantially spherical shape, as shown in FIG. 5C. Namely, by taking the surface segment 8*b* into the core segment 8*a* by solid-solution, the metallic powder 8 containing the noble metal such as silver having a high melting point as the surface segment 8*b* can be shape-changed into the metallic particle 18 by the heating during the re-flow process. By exposure of the surface of the core segment 8*a* with the surface segment 8*b* completely taken in as well as the above shape-change, an oxidation film 8*d* due to heating and oxidation of the core segment 8*a* is formed on the surface of the metallic particle 18. The oxidation film 8*d* presents an effect of improving the insulation after solder-connection as described later.

FIG. 4C slows the state where the solder 6*a* and the metallic article 18 are solidified by cooling the electronic component 4 and substrate 1 after a predetermined heating cycle during the re-low process has been completed. By solidification of the solder 6*a*, a solder portion 16 connecting the component electrode 4*b* and the electrode 2 by soldering is formed. In the vicinity of the electrode surface 2*a* of the solder portion 16, the metallic powder 8 taken in the solder during the soldering process resides in an alloy state or solid-solution state. On the electrode surface 2*a* and around the electrode 2, the residue (resin component and activator) 3*a* after the solvent component has been evaporated from the flux 3 remains together with the substantially spherical metallic particles 18 generated by melting and solidification of the metallic powder 8 not taken into the solder portion 16.

Figure 2C:
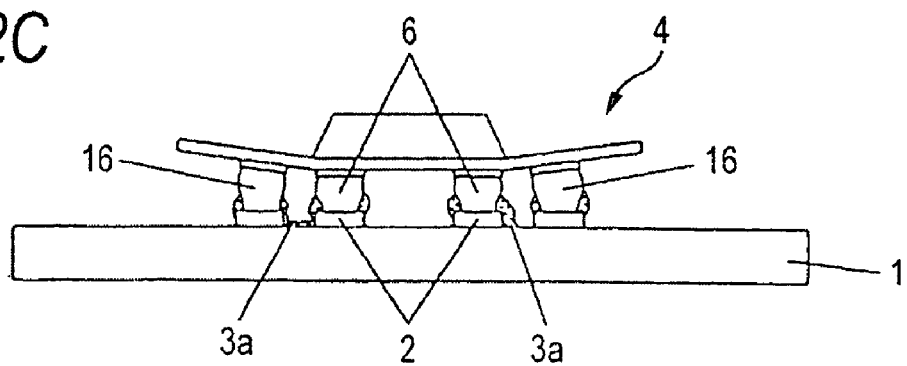

FIG. 2C shows the state where soldering of the electronic component 4*b* on the substrate 1 has been completed as a result that the solder portions 16 each coupling the component electrode 4 with the electrode 2 were formed for all the component electrodes 4*b* and electrodes 2. Thus, the soldering structure of the electronic component as shown in FIG. 6 is manufactured. As seen from FIG. 6, the component electrode 4*b* and the electrode 2 are connected by the solder portion 16, and around the electrode 2, the flux residue 3*a* partially covering the lower part of the solder portion 16 and extended to the surface of the substrate 1 remains in a deposited state. In the flux residue 3*a*, the metallic particles 18 are scattered which remain as a result that they have not been brought into contact with the molten solder 6*a* during the re-flow process and not taken into the solder portion 16.

In short, the soldering structure of the electronic component is in a configuration having the solder portions 16 each connecting the component electrode 4*b* of the electronic component 4 to the electrode 2 and flux residue 3a remaining on the surfaces of the solder portions 16 and of the substrate 1, in which the metallic powder 8 not brought into contact with the molten solders 6a is molten to form a substantially spherical shape and the metallic particles 18 each having the oxidation film 8d on the surface are contained in the flux residue 3a. Such a soldering structure can present the following excellent effects in ensuring the insulation between the electrodes.

In the non-cleaning method in which cleaning for removing the flux is not carried out after the solder-connection step, the flux residue 3a remains around the electrodes 2 as it is. Where the metal such as gold or silver is employed as the metallic powder to be mixed into the flux as it is, according to the quantity of the residue, migration may occur which electrically corrodes the area between the electrodes thereby to deteriorate the insulation therebetween. Therefore, traditionally, in view of assuring the insulation, it was necessary to restrict the metallic powder to be mixed to a low percentage of contents. As a result, a situation was occurred that the effect of improving the solder-wettability leading the molten solder in the re-flow process is not sufficiently realized.

On the other hand, using the metallic powder 8 having the composition described above, even where a considerable amount of the metallic powder 8 remains around the electrodes 2 after the solder-connection step has been completed, the metallic powder 8 is molten by the heating during the re-flow to become the substantially spherical metallic particle 18. Therefore, the probability generating the state where the particles are in contact with one another to be coupled is very low. Further, in cooperation with the fact that the surface of the metallic particle 18 is covered with the oxidation film 8d which is electrically stable, the occurrence of migration can be effectively prevented, thereby ensuring good insulation. Thus, by using the metallic powder 8 having the composition described above such that the metallic powder of a quantity enough to assure the solder-wettability in the flux is mixed, the solder-connectivity can be improved and the insulation after the solder-connection can be also ensured, thereby improving the reliability of mounting.

In other words, by using the metallic powder 8 having the composition described above, the flux 3 of the non-cleaning type excellent in both solder-connectivity and insulation can be realized. Specifically, in the case where the electronic component with bumps formed of lead-free solder which is high in the hardness and difficult to be crushed is a target of mounting, also in a state where there are gaps between the bumps and the circuit electrodes of the substrate owing to warping of the electronic component and changes in the bump size, it is possible to effectively prevent occurrence of the poor mounting that the bump is not normally soldered on the circuit electrode. In addition, also where the non-cleaning method not carrying out the cleaning for flux removal after the soldering is adopted, satisfactory insulation can be ensured.

Additionally, in the above embodiment, the non-cleaning method not carrying out the cleaning for flux removal after the re-flow was adopted. However, where higher reliability is required, the metallic particles 18 solidified to become spherical and the flux residue 3a are cleaned by cleaning water so that they are removed from the substrate 1. In this cleaning step, since the remaining metallic powder resides in the flux residue 3a in the form of the metallic particles 18 which can be easily removed, good cleaning quality can ensured by a simple cleaning method.

The above method for soldering an electronic component is in a configuration in which the solder bump 6 is aligned with the electrode 2 with the flux 3 having the above composition intervening between the solder bump 6 and the electrode 2, the electronic component 4 and the substrate 1 are heated to melt the solder bump 6, the molten solder is wet and spread along the surface of the metallic powder 8 to reach the electrode 2, heating is further continued so that the metallic powder 8 remaining without being in contact with molten solder is molten into substantially spherical shape, and thereafter the substrate 1 and the electronic component 4 are cooled so that the molten metallic powder 8 and the solder are solidified.

In the embodiment described above, in a step of applying the flux 3, the flux 3 is duplicated on the bumps 6. However, other various methods can be adopted. For example, as seen from FIG. 7A, the flux 3 is jetted by a dispenser 9 so that it is supplied to the electrode 2. Further, as seen from FIG. 7B, using a duplicating pin 10, the flux 3 may be supplied to the electrode 2 by duplication.

Further, as seen from FIG. 7C, by screen printing, the flux 3 may be printed on the electrodes 2. Specifically, a mask plate 11 with pattern holes 11a corresponding to the electrodes 2 is mounted on the substrate 1 and the flux 3 filled in the pattern holes 11a by a squeeze 12 is printed on the surface of the electrodes 2.

Embodiment 2

Figure 8:
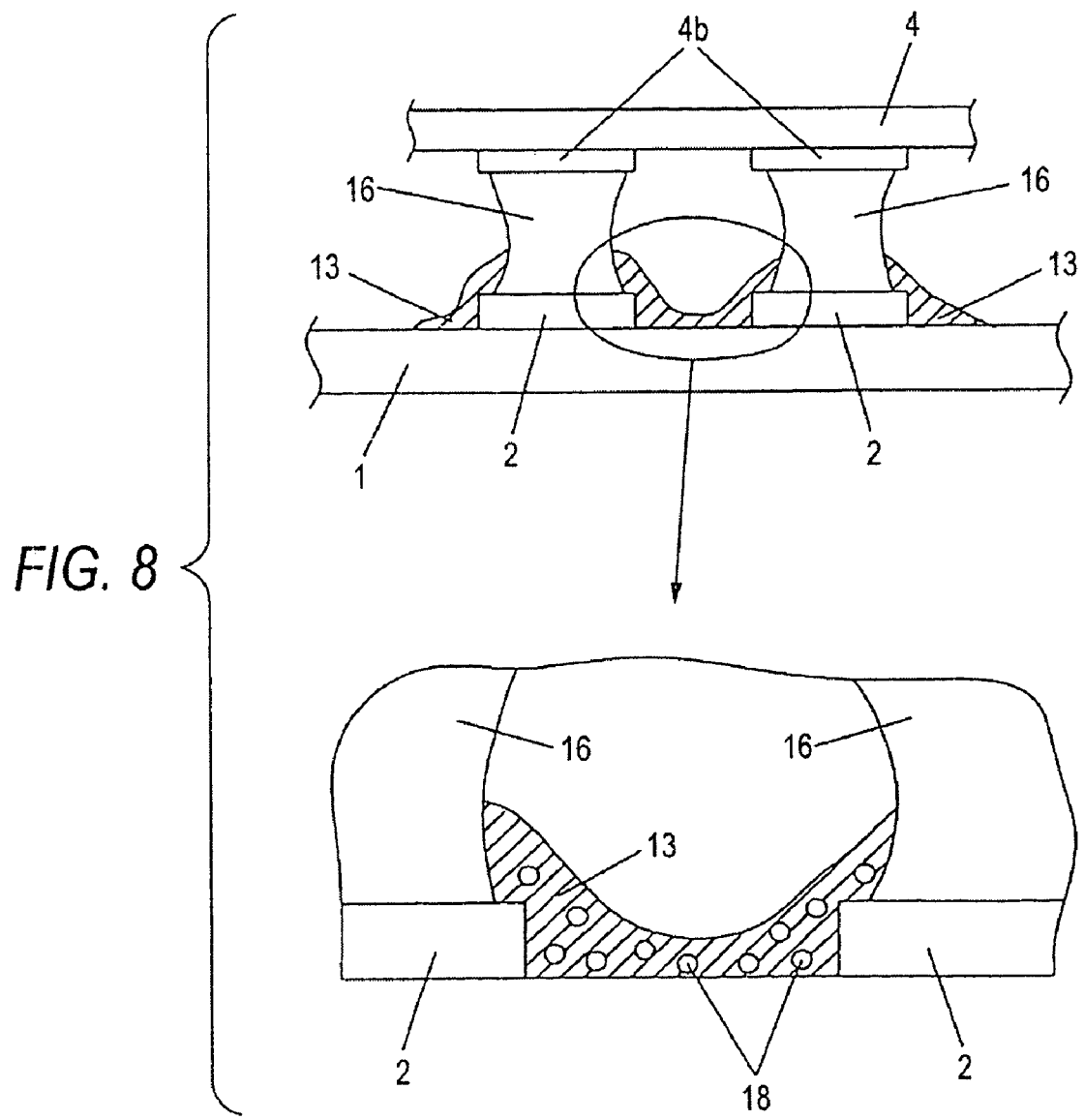
FIG. 8 is a sectional view of the soldering structure of an electronic component according to the second embodiment of this invention.

FIG. 8 is a sectional view of a soldering structure of an electronic component according to the second embodiment of this invention. In the second embodiment, as a solder-connection assistant for enhancing the solder-connectivity between the bump 6 and the electrode 2, a thermosetting resin having an activating function is employed in place of the flux 3 when the electronic component 3 as in the first embodiment is soldered to the substrate 1.

As seen from FIG. 8, as in the first embodiment, the component electrodes 4b and the electrodes 2 are connected by the solder portions 16, respectively. Around the electrodes 2, resin portions 13 each having a shape partially covering the lower part of the solder portions 16 and expanded to the surface of the substrate 1 are formed. The resin portion 13 is formed when the thermosetting resin used as the solder-connection assistant is thermally hardened by the heating during the re-flow process and has a function of reinforcing the connecting portion between the solder portion 16 and the electrode 2. In the resin portion 13, the metallic particles 18 are scattered which remain as a result that they have not been brought into contact with the solder 6a molten during the re-flow process and not taken into the solder portion 16.

The soldering structure of an electronic component is in a configuration having solder portions 16 each for connecting the component electrode 4b of the electronic component 4 and electrode 2 and resin portions 13 each for reinforcing the connecting portion between the solder portion 16 and the electrode 2, wherein the metallic powder 8 not brought into contact with the molten solder is molten to become substantially spherical and metallic particles 18 thus created each having the oxidation film 8d on the surface are contained in the resin portion 13. By such a soldering structure, like the first embodiment, the insulation between the electrodes can be assured and the connecting portion between the solder portion 16 and the electrode 2 can be effectively reinforced, thereby further improving the reliability of mounting.

This soldering structure can be realized by substituting the thermosetting resin having an activating function for the flux 3 in the method of soldering an electronic component according to the first embodiment (see FIGS. 1A to 1C and 2A to 2C). Namely, in the method for soldering an electronic component according to the second embodiment is in a configuration in which the bump 6 of the electronic component 1 is aligned with the electrode 2 of the substrate 1 with the thermosetting resin containing the same metallic powder 8 as in the first embodiment intervening between the bump 6 and the electrode 2, the electronic component 4 and the substrate 1 are subsequently heated to melt the bump 6, and the solder thus molten is wet and spread along the surface of the metallic powder 8 to reach the electrode 2.

The heating is further continued so that the metallic powder 8 remaining without being in contact with molten solder is molten into substantially spherical shape, thereby promoting the hardening reaction of the thermosetting resin. Thereafter, the substrate 1 and the electronic component 4 are cooled so that the molten metallic powder 8 and the solder 6a is solidified. In this soldering method, as in the first embodiment, improvement of the solder-connectivity and insurance of the insulation can be combined.

INDUSTRIAL APPLICABILITY

The method for soldering an electronic component and soldering structure of the electronic component according to this invention provide the effect of combining improvement of the solder connectivity and insurance of the insulation. They are useful for the use of soldering prone to generate a gap between the bump and the electrode, such as soldering for stacking a package component to manufacture a semiconductor device.

The invention claimed is:

1. A method for soldering an electronic component on a substrate such that a solder bump formed on the electronic component aligned with an electrode of the substrate is heated and the solder bump thus molten is soldered on the electrode, comprising the steps of:
    aligning the solder bump of said electronic component with the electrode of the substrate with flux intervening between the solder bump and the electrode, the flux containing metallic powder having a flake or dendrite shape including a core segment of the metal molten at a higher temperature than the liquid phase temperature of solder constituting said solder bump and a surface segment of the metal with good-wettability for said solder molten and to be solid-solved in said core segment molten;
    heating said electronic component and said substrate to melt said solder bump so that the molten solder is wet and spread along the surface of the metallic powder to reach the electrode;
    further continuing heating so that the metallic powder remaining without being in contact with said molten solder is molten into substantially spherical shape; and
    thereafter cooling said substrate and said electronic component so that the molten metallic powder and said solder is solidified.

2. A method for soldering an electronic component according to claim 1, wherein the metal constituting said surface segment is gold (Au), silver (Ag) or platinum (Pt); and the metal constituting said core segment is tin (Sn) or a tin-series alloy.

3. A method for soldering an electronic component according to claim 1, further comprising the step of
    cleaning the metallic powder solidified to become spherical and residue of said flux using a cleaning water so that they are removed from the substrate.

4. A method for soldering an electronic component on a substrate such that a solder bump formed on the electronic component aligned with an electrode of the substrate is heated and the solder bump thus molten is soldered on the electrode, comprising the steps of:
    aligning the solder bump of said electronic component with the electrode of the substrate with thermosetting resin intervening between the solder bump and the electrode, the thermosetting resin containing metallic powder having a flake or dendrite shape including a core segment of the metal molten at a higher temperature than the liquid phase temperature of solder constituting said solder bump and a surface segment of the metal with good-wettability for said solder molten and to be solid-solved in said core segment molten;
    heating said electronic component and said substrate to melt said solder bump so that the molten solder is wet and spread along the surface of the metallic powder to reach the electrode;
    further continuing the heating so that the metallic powder remaining without being in contact with said molten solder is molten into substantially spherical shape;
    promoting a hardening reaction of said thermosetting resin by said heating; and
    thereafter cooling said substrate and said electronic component so that the molten metallic powder and said solder are solidified.

5. A method for soldering an electronic component according to claim 4, wherein the metal constituting said surface segment is gold (Au), silver (Ag) or platinum (Pt); and the metal constituting said core segment is tin (Sn) or a tin-series alloy.

6. A soldering structure of an electronic component soldered on a substrate by the soldering method according to claim 1, comprising having a solder portion for connecting said electronic component and said electrode and a flux residue remaining on the surfaces of said solder portion and of the substrate, wherein metallic particles creates as a result that the metallic powder not brought into contact with the molten solder is molten to become spherical are contained in said flux residue.

7. A soldering structure of an electronic component according to claim 6, wherein said metallic particles each has an oxidation film on the surface.

8. A soldering structure of an electronic component soldered on a substrate by the soldering method according to claim 4, comprising having a solder portion for connecting said bump and said electrode of the substrate and a resin portion for reinforcing a connecting portion between the solder portion and the electrode, wherein metallic powder created as a result that said metallic powder not brought into contact with the molten solder is molten to become substantially spherical are contained in said resin portion.

9. A soldering structure of an electronic component according to claim 8, wherein said metallic particles each has an oxidation film on the surface.

* * * * *